United States Patent [19]

Ray

[11] Patent Number: 4,892,861

[45] Date of Patent: Jan. 9, 1990

[54] LIQUID PHASE SINTERED SUPERCONDUCTING CERMET

[75] Inventor: Siba P. Ray, Plum Boro, Pa.

[73] Assignee: Aluminum Company of America, Pittsburgh, Pa.

[21] Appl. No.: 85,959

[22] Filed: Aug. 14, 1987

[51] Int. Cl.$^4$ .................... C22C 29/12; H01L 39/12
[52] U.S. Cl. ........................................ 505/1; 75/232; 75/234; 75/235; 252/514; 252/521; 419/20; 419/21; 419/22; 419/47; 505/785
[58] Field of Search ...................... 419/47, 20, 21, 22; 75/232, 234, 235; 252/514, 521

[56] References Cited

U.S. PATENT DOCUMENTS

| | | | |
|---|---|---|---|
| 3,796,553 | 3/1974 | Daunt | 174/126.5 |
| 3,815,224 | 6/1974 | Pickus et al. | 174/126.5 |
| 4,050,147 | 9/1977 | Winter et al. | 29/599 |
| 4,316,785 | 2/1982 | Suzuici et al. | 29/599 |
| 4,358,783 | 11/1982 | Hebard et al. | 427/62 |
| 4,472,351 | 9/1984 | Gonczy | 419/46 |
| 4,770,701 | 9/1988 | Henderson et al. | 75/232 |
| 4,826,808 | 5/1989 | Yurek et al. | 505/1 |

OTHER PUBLICATIONS

Kaysser et al., "Liquid Phase Sintering of Ceramics", from *Emergent Process methods for High Technology Ceramics*, Ed. Davis et al., Plenum Press, N.Y. 1982, pp. 225-231.

Chem Abs. 107:227120r, Moiseev et al., Fiz. Nizk Temp (Kiev), Jun. 1987, Yurek et al., Journal of the Electrochemical Society, vol. 134, No. 10, Oct. 1987, pp. 2635-2636.

F. Beech et al., "Neutron Study of the Crystal Structure and Vacancy Distribution in the Superconductor $Ba_2YCu_3O_{9-\delta}$", *Physical Review B*, vol. 35, No. 16, Jun. 1, 1987, pp. 8778-8781.

P. Chaudhari et al., "Critical-Current Measurements in Epitaxial Films of $YBa_2Cu_3O_{7-x}$ Compound", *Physical Review Letters*, vol. 58, No. 25, Jun. 22, 1987, pp. 2684-2686.

D. R. Clarke, "The Development of High-Tc Ceramic Superconductors: An Introduction", *Advanced Ceramic Materials*, vol. 2, No. 3B, 1987, pp. 273-292.

T. R. Dinger et al., "Direct Observations of Electronic Anisotropy in Single-Crystal $Y_1Ba_2Cu_3O_{7-x}$", *Physical Review Letters*, vol. 58, No. 25, pp. 2687-2690.

J. W. Ekin, "Transport Critical Current in Bulk Sintered $Y_1Ba_2Cu_3O_x$ and Possibilities for its Enhancement", *Advanced Ceramic Materials*, vol. 2, No. 3B, 1987, pp. 586-592.

K. G. Frase et al., "Phase Compatibilities in the System $Y_2O_3$—BaO—CuO", *Advanced Ceramic Materials*, vol. 2, No. 3B, 1987, pp. 295-302.

R. M. Hazen et al., "Crystallographic Description of Phases in the Y—Ba—Cu—O Superconductor", *Physical Review B*, vol. 35, No. 13, May 1, 1987, pp. 7238-7241.

R. W. McCallum et al., "Problems in the Production of $YBa_2Cu_3O_x$ Superconducting Wire", Advanced Ceramic Materials, vol. 2, No. 3B, 1987, pp. 388-400.

A. J. Panson et al., "Effect of Compositional Variation and Annealing in Oxygen on Superconducting Properties of $Y_1Ba_2Cu_3O_{8-y}$", *Physical Review B*, vol. 35, No. 16, Jun. 1, 1987, pp. 8774-8777.

S. B. Quadri et al., "X-Ray Identification of the Superconducting High-T Phase in the Y—Ba—Cu—O System", Physical Review B, vol. 35, No. 13, May 1, 1987, pp. 7235-7237.

Quentin Robinson et al., "Sinter-Forged $YBa_2Cu_3O_{7-\delta}$", *Advanced Ceramic Materials*, vol. 2, No. 3B, 1987, pp. 380-387.

(List continued on next page.)

*Primary Examiner*—Paul Lieberman
*Assistant Examiner*—Linda D. Skaling
*Attorney, Agent, or Firm*—Andrew Alexander

[57] ABSTRACT

Disclosed is a cermet exhibiting superconducting properties with improved mechanical properties comprising a mixture of a superconducting ceramic and one or more metals, the cermet resulting from liquid phase sintering at a temperature at which one of the metals is molten and below the melting temperature of the superconducting ceramic.

10 Claims, 3 Drawing Sheets

OTHER PUBLICATIONS

R. S. Roth et al., "Phase Equilibria and Crystal Chemistry in the System Ba—Y—Cu—O", *Advanced Ceramic Materials,* vol. 2, No. 3B, 1987, pp. 303–312.

A. Safari et al., "Processing Study of High Temperature Superconducting Y—Ba—Cu—O Ceramics", *Advanced Ceramic Materials,* vol. 2, No. 3B, 1987, pp. 492–497.

Yoshitami Saito et al., "Composition Dependence of Superconductivity in Y—Ba—(Ag,Cu)—O System", *Japanese Journal of Applied Physics,* vol. 26, No. 5, pp. L832–L833.

J. M. Tarascon et al., "Processing and Superconducting Properties of Perovskite Oxides", *Advanced Ceramic Materials,* vol. 2, No. 3B, 1987, pp. 498–505.

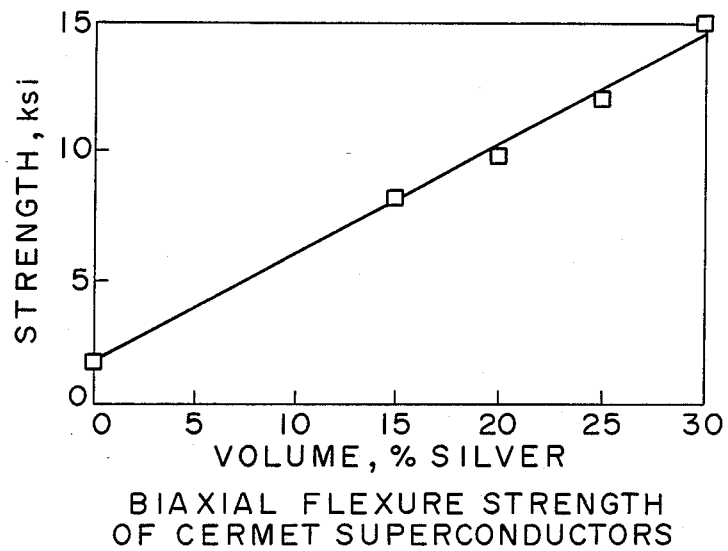
BIAXIAL FLEXURE STRENGTH
OF CERMET SUPERCONDUCTORS
FIGURE I

LIQUID PHASE SINTERED SUPERCONDUCTING CERMET

BACKGROUND OF THE INVENTION

1. Field of the Invention

This invention relates to a superconducting cermet material formed from a triple-layer perovskite type superconducting ceramic material and one or more precious metals or metals or alloys thereof more noble than copper; and a method of making the superconducting cermet.

2. Description of the Related Art

Since the discovery of superconductivity in 1911, the Phenomena of a material being able to conduct electricity with almost no resistance when the material is cooled to a temperature approaching absolute zero (0° K.) has remained an interesting scientific curiosity having few applications which would justify the expense of maintaining the necessary liquid helium cooled system.

Recently, however, superconducting ceramic materials have been produced which exhibit this phenomena at much higher temperatures, e.g., 40° K., and, in some cases even higher than the boiling point of liquid nitrogen which boils at about 77° K. The ability to produce superconductivity in a material cooled by liquid nitrogen completely changes the economics which have previously restricted the applications to which superconductivity could be applied.

These new ceramic materials are sometimes referred to as triple-layer perovskite compounds because of the crystallography of the resulting structure; or 1-2-3 compounds because of the atomic ratios of 1 atom of a rare-earth element such as in the Lanthanide series (Nd, Sm, Eu, Gd, Tb, Dy, Ho, Er, Tm, Yb, Lu) or yttrium, 2 atoms of an alkaline earth metal such as barium or strontium, and 3 atoms of copper. The superconducting ceramic also contains from 6.5+ to 7− atoms of oxygen which is usually referred to as $O_{(6.5+x)}$ where x is greater than 0 and less than 0.5, resulting in a chemical formula such as, for example, $YBa_2Cu_3O_{(6.5+x)}$.

Saito et al in an article entitled "Composition Dependence of Superconductivity in Y—Ba—(Ag, Cu)—O System" in the *Japanese Journal of Applied Physics*, Vol. 26, No. 5, May, 1987, pp. L 832–833, (incorporated herein by reference) have substituted silver for copper in the superconducting ceramic and found that as the level of silver was increased, superconducting capability decreased with temperature, particularly at higher levels of silver.

While the superconducting properties of such a ceramic material have been confirmed by demonstration of the Meissner effect wherein the superconductor, when cooled to superconducting temperature, will exhibit magnetic properties sufficient to levitate a magnet above the superconductor, the material is deficient in some of the essential physical properties needed to permit fabrication and practical usage of structures from the material.

Most notable of these deficiencies is the extreme brittleness and poor mechanical strength of the superconducting ceramic structures which inhibits formation of shaped structures, e.g., coils or wires therefrom; and the low current carrying capabilities of the superconducting ceramic. The superconducting ceramic material also shows evidence of microcracking which is a further indication of its brittleness and would also effect its critical current density $J_c$. Most applications of the new high $T_c$ superconductors require high critical current densities ($J_c$) of more than $10^4$–$10^5$ A/cm$^2$, often in the presence of a significant magnetic field (1–10 Tesla). Zero field transport $J_c$ in bulk sintered samples of $YBa_2Cu_3O_{6.5+x}$ samples are typically $10^2$–$10^3$ A/cm$^2$ only. In a magnetic field, these values are even lower. Thus, there is great need for improved critical Properties (see "Transport Critical Current In Bulk Sintered $Y_1Ba_2Cu_3O_x$ and Possibilities for Its Enhancement", J. W. Ekin, *Advanced Ceramic Materials*, Vol. 2, No. 3B, Special Issue, 1987, incorporated herein by reference). In addition, the superconducting ceramic material, as produced, is of rather low density, i.e., about 60–75% of theoretical density, and is difficult to densify, resulting in a low environmental stability and a sensitivity to moisture and $CO_2$. Low density also leads to poor superconducting and mechanical properties.

It would, therefore, be of great value to be able to produce a compound or structure using such ceramic superconducting material which would, while preserving the superconducting effects of the ceramic, have superior mechanical strength, exhibit less brittleness (i.e., be more malleable), improve critical current density capabilities, reduce or eliminate microcracking, and have a higher density, as well as improving the environmental durability of the material.

SUMMARY OF THE INVENTION

It is, therefore, an object of this invention to provide a cermet composition having superconducting properties at temperatures, for example of liquid nitrogen, e.g., 77° K. or as desired, with little or no microcracking and capable of being formed to provide a preferred grain orientation, the composition exhibiting improved flexure strength and higher density over the corresponding ceramic material used in making the cermet composition.

It is another object of this invention to provide a cermet composition exhibiting superconducting properties having improved critical current density capabilities.

It is yet another object of this invention to provide a cermet composition exhibiting superconducting properties with improved mechanical properties and having in situ stabilization capabilities comprising a mixture of a superconducting ceramic material and one or more precious metals selected from the class consisting of silver, gold, and one of the six platinum metals or alloys thereof.

It is a further object of this invention to provide a cermet composition exhibiting superconducting properties with improved mechanical properties and having improved critical current density capabilities comprising a mixture of a superconducting ceramic material consisting essentially of a rare earth element, an alkaline earth metal element, copper, and oxygen; and one or more precious metals selected from the class consisting of silver, gold, and one of the six platinum metals.

It is yet a further object of this invention to provide a cermet composition exhibiting superconducting properties with improved mechanical properties and capable of improved critical current density levels comprising a mixture of a superconducting ceramic material having the formula $RM_2Cu_3O_{(6.5+x)}$ wherein R is a rare earth element, M is an alkaline earth metal element, and x is greater than 0 and less than 0.5; and one or more precious metals selected from the class consisting of silver, gold, and one of the six platinum metals.

It is another object of this invention to provide a method of making a cermet composition exhibiting superconducting properties with improved mechanical properties which comprises sintering a mixture of a superconducting ceramic material, having the formula $RM_2Cu_3O_{(6.5+x)}$ wherein R is a rare earth element, M is an alkaline earth metal element, and x is greater than 0 and less than 0.5, with one or more precious metals selected from the class consisting of silver, gold, and one of the six platinum metals at a temperature preferably above the melting point of the precious metal but below the melting point of the ceramic material.

It is still another object of this invention to provide a method of making a cermet composition exhibiting superconducting properties at liquid nitrogen temperatures, for example, with improved mechanical properties which comprises sintering a mixture of a superconducting ceramic material, having the formula $RM_2Cu_3O_{(6.5+x)}$ wherein R is one or more rare earth elements, M is one or more alkaline earth metal elements, and x is greater than 0 and less than 0.5, with one or more precious metals selected from the class consisting of silver, gold, and one of the six platinum metals at a temperature preferably above the melting point of the precious metal or alloy thereof but below the melting point of the ceramic material and then annealing or heating the cermet in an oxygen-containing atmosphere at a temperature of from about 400–750° C., for example.

These and other objects of the invention will be apparent from the following description and accompanying drawings.

BRIEF DESCRIPTION OF THE DRAWINGS

FIG. 1 is a graph illustrating the rise in flexure strength of a superconducting cermet as a function of the amount of precious metal present.

DETAILED DESCRIPTION OF THE INVENTION

Figure 2B:
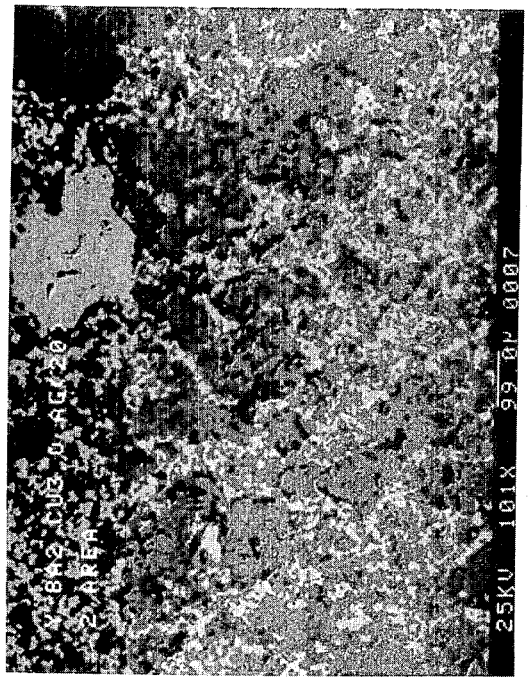
FIG. 2B is a photomicrograph at the same magnification as FIG. 2A showing the density of the cermet of the invention formed from a superconducting ceramic and a precious metal.

In accordance with the invention a superconducting cermet consisting essentially of a superconducting ceramic material and a precious metal or an alloy thereof that is a metal or metal alloy more noble than copper, is formed by sintering a superconducting ceramic material with a precious metal-bearing material. The superconducting cermet is characterized by a higher flexure strength, i.e., less brittleness and higher density as well as an absence of microcracking, as compared to the superconducting ceramic material from which it is made. By use of precious metals herein is meant to include metals or alloys thereof more noble than copper.

The superconductive ceramic material used to make the superconducting cermet of the invention comprises a material containing one or more rare earths capable of forming a superconducting ceramic compound; one or more alkaline earth metals capable of forming a superconducting compound; copper or copper and another metal or metals substituted for copper or a portion of the copper, e.g., up to 50% of the copper; and oxygen or a replacement therefor or small additions thereto of other anions, for example, F and S. The superconducting ceramic has the general formula $R_{1+z}M_{2-z}(Cu_{1-y}N_y)_3O_{6.5+x}$ wherein R is one or more rare earth elements capable of reacting to form a superconducting ceramic, M is one or more alkaline earth metal elements capable of reacting to form a superconducting ceramic, x is greater than 0 and less than 0.5, y is 0 to 0.5, z is 0 to 0.6 and N is a mono-, di- or trivalent metal. The more specific formula is $RM_2Cu_3O_{(6.5+x)}$ for the superconducting ceramic.

The rare earth element or elements which may be used in forming the suPerconducting ceramic useful in the invention may comprise any rare earth element or combination of rare earth elements capable of reacting to form a superconducting ceramic. Generally, the rare earth may, therefore, comprise any lanthanide series rare earth with the possible exceptions of cerium and praseodymium, which have not, to date, been successfully reacted to form such superconducting ceramic material. Preferred rare earth elements include lanthanum and yttrium.

The alkaline earth metal element or elements which may be used in forming the superconducting ceramic useful in the invention include any one or more alkaline earth metals capable of reacting to form a superconducting ceramic. Preferred alkaline earth metals include barium and strontium, or combinations thereof, with barium particularly preferred.

The one or more rare earth, one or more alkaline earth metal, and copper reactants used in forming the superconducting ceramic may be initially in the form of oxides, carbonates, or any other salt form wherein the anion will decompose upon heating. At least one or more of the reactants will, preferably, be either in oxide form or include an oxygen-bearing anion to provide a source of oxygen for the superconducting ceramic. Alternatively, a separate or supplemental amount of oxygen may be supplied to the reaction to provide from slightly over 6.5 to slightly under 7 atoms of oxygen per atom of rare earth, while the rare earth/alkaline earth metal/copper atomic ratio is, as indicated in the formula, one atom of rare earth per two atoms of alkaline earth metal, and three atoms of copper, i.e., a ratio of 1:2:3.

In the formation of the superconductor cermet, it is preferred to have the superconducting ceramic component prepared prior to adding a metallic component to form said cermet wherein the components are interwoven. That is, this approach is preferred over the use of alloys containing a noble metal, which alloy is subjected to oxidation to provide a superconducting material. It is contemplated within the purview of the invention to provide a mixture containing a superconducting ceramic and an alloy capable of being oxidized to provide superconducting properties. That is, the alloy may be oxidized after being mixed with the superconducting ceramic.

The superconducting ceramic material used in the invention may be formed by thoroughly mixing the initial reactants together as powders of −100 mesh (Tyler) or smaller particle size, to form a homogeneous mixture with uniform distribution of the reactants. This may be accomplished by ball milling or grinding the powders for a suitable time. The powder mixture is then optionally pressed into a compact form, and then heated in air at ambient or higher atmosphere to a temperature of from about 900–1000° C. and maintained at this temperature for at least about 12 hours. The mixture is then allowed to cool and then is crushed to −100 mesh (Tyler) or smaller particle after which the entire process is repeated two more times to achieve a completely homogeneous ceramic material. The ceramic is then annealed or heated in an oxygen-bearing atmosphere at ambient pressure at a temperature of from about 650–750° C. for a period of from about 12–36 hours, preferably about 24–36 hours. The superconducting ceramic powder may also be produced by other conventional powder making processes, e.g., decomposition of nitrates, oxalates, citrates, etc., or powders produced by a sol-gel technique.

To form the cermet in accordance with the invention, the superconducting ceramic, made as described above, is again crushed to form −100 mesh (Tyler) or smaller particles which are then mixed with a precious metal-bearing powder of −100 mesh (Tyler) or finer particle size by ball milling or any other convenient method which will provide thorough mixing and uniform distribution of the ceramic material with the precious metal-bearing material.

The precious metal-bearing powder mixed with the superconducting ceramic to form the cermet of the invention may be in metallic form or in oxide or salt form such as a sulfide or a fluoride, as desired. The metal in the powder may be a diamagnetic metal, e.g., silver and gold and must be more noble than copper, should not react with the oxygen in the superconducting ceramic, should preferably melt at a temperature lower than the sintering temperature, e.g., approximately 900° C., and, preferably, will not alloy with the metals in the superconducting ceramic. The precious metals, i.e. Group VIII metals 44–46 and 76–78 (the platinum metals) and Group IB metals 47 and 79 (silver and gold), which are also excellent electrical conductors, generally satisfy these criteria. Alloys of these metals may also be used.

Thus the metal-bearing powder used in forming the cermet of the invention preferably comprises one or more of the precious metals silver, gold, ruthenium, rhodium, palladium, osmium, iridium, or platinum which represent the consecutive atomic numbers 44–47 in Groups VIII and in IB as well as 76–79 in Groups III and IB. While these precious metals may be used in metallic form, preferably they are used in the form of oxides. Sulfides or halides such as chlorides and fluorides or mixtures of these may be used, depending upon the composition of the ceramic, for example. Precious metal compounds that are more easily comminuted to fine particles of −100 mesh (Tyler) or smaller are preferred. These may be more thoroughly mixed with the superconducting ceramic powder to form a homogeneous and uniformly distributed powder mixture.

Particularly preferred precious metal-bearing compounds are silver compounds such as silver oxide because it can be easily made available in fine particulate form and, when heated to the preferred sintering temperature, the silver compound will decompose at 230° C. to silver and the corresponding anion such as oxygen and the silver will then melt at 962° C. to provide a liquid phase sintering aid or densification agent. Under certain conditions, silver sulfide or silver halide may be used and may be combined with silver oxide. Furthermore, when silver oxide is used, the oxide from the decomposed silver oxide can be used as a source of oxygen when the sintering step is carried out in a sealed vessel and the subsequent oxygen annealing step is carried out in the same vessel by cooling the cermet from the sintering temperature down to the annealing temperature.

The precious metal-bearing powder is mixed with the superconducting ceramic powder in a ratio which may vary from as little as 5 volume percent (vol. %——calculated based on the volume of the final cermet) precious metal and 95 vol. % ceramic to as high as a 50/50 vol. % mixture of precious metal to superconducting ceramic. Preferably the ratio will be from about 5 to 40 vol. %, and more preferably from about 15 to 30 vol. %, precious metal in the powder mixture to achieve the desired increase in both mechanical and electrical properties while still retaining the superconductive characteristics in the resulting cermet.

The precious metal/ceramic powder mixture is then liquid phase sintered at an elevated temperature which is preferable above the melting point of the precious metal but should be below the melting point of the ceramic. The sintering temperature preferably is about 950–1000° C., more preferably about 965–970° C.

The mixture is sintered for a period of from about 12–36 hours at ambient or higher pressure in an oxygen-bearing atmosphere.

After the powder mixture has been sintered, the resulting cermet is annealed at a temperature of from about 400–750° C. in an oxygen-bearing atmosphere, which may comprise air, at ambient pressure, although higher pressure can be used if desired. Effects of annealing are disclosed in an article by Panson et al entitled "Effect of Compositional Variation and Annealing in Oxygen on Superconducting Properties of $Y_1Ba_2Cu_3O_{8-y}$", Physical Review B. Vol. 35, No. 16, pp. 8774–7, 1987 The American Physical Society (incorporated herein by reference). This annealing step serves to provide the desired ratio of over 6.5 atoms up to less than 7 atoms of oxygen per atom of rare earth, two atoms of alkaline earth metal, and three atoms of copper according to the formula $RM_2Cu_3O_{(6.5+x)}$, wherein R is one or more rare earth elements capable of reacting to form a superconducting ceramic, M is one or more alkaline earth metal elements capable of reacting to form a superconducting ceramic, and x is greater than 0 and less than 0.5.

The resulting cermet is found to be of much higher flexure strength than the corresponding ceramic. Examination of the cermet also reveals an absence of the microcracking found in the corresponding ceramic material In addition, the bulk density of the cermet of the invention can be increased significantly, e.g., over 84%, over that of the low bulk density of the corresponding ceramic used in making the cermet, which ceramic is usually only about 65% of its theoretical density. It should be noted that improved processing techniques can lead to high bulk density, e.g., over 97%, of the ceramic which in turn can lead to even better cermet material.

The cermet of the invention may be further worked as by forging, for example, to fabricate the cermet into a shaped object or by extruding the cermet to form wire therefrom. The forging may be carried out at a temperature of from about 400° to about 900° C.

An important feature of the present invention results from the addition of the precious metal. That is, it has been discovered that the critical current density of the cermet can be increased over that of the superconducting ceramic used in making the cermet. By critical current density is meant the current density above which a superconductor loses its superconducting state. The importance of critical current density is disclosed in a paper by Chaudhari et al entitled "Critical-Current Measurements in Epitaxial Films of $YBa_2Cu_3O_{7-x}$ Compound", *Physical Review Letters*, Vol. 58, No. 25, June 22, 1987, pp. 2684–6 (incorporated herein by reference). Thus, it will be understood that the higher the critical current density, the greater the efficiency and usefulness of the superconductor. Further, it will be understood that one condition which contributes to increasing the critical current density is orientation of the grains For example, in the superconducting ceramic having the formula $Ba_2YCu_3O_{9-L}$ where $L \leq 2.0$, current in the superconducting mode moves most readily in the Cu—O plane, as shown in the paper by Beech et al entitled "Neutron Study of the Crystal Structure and Vacancy Distribution in the Superconductor $Ba_2YCu_3O_{9-\delta}$", *Physical Review B*, Vol. 35, No. 16, June 1, 1987, pp. 8778–81 (incorporated herein by reference).

It will be understood that in ceramic materials generally it is difficult to change the shape of or orient the grains in a ceramic matrix. However, it is desirable to orient crystallites in the material so that the strong superconducting axes are parallel to the direction of transport current. During the mechanical deformation of the ceramic or cermet, e.g., hot forging or extrusion, the grain orientation is achieved due to the anisotropic mechanical properties of the ceramic grains. Thus, preferred orientation can be achieved during mechanical processing, for example. It is believed that silver or other metals aid in achieving the preferred grain orientation while still maintaining superconductivity The preferred orientation improves the critical current density.

In another aspect of the invention, the cermet of the present invention has the advantage that it has increased stabilization, as compared to the superconducting ceramic. That is, the cermet, because of the precious metals added in accordance with the invention, has stabilization provided in-situ. The cermet of the present invention preferably contains at least two continuous phases containing superconducting ceramic and a precious metal. The stabilizer may be interwoven with the superconducting ceramic. This aspect of the invention contemplates in-situ or interwoven stabilizers into any type of superconducting ceramic Additional enveloping type stabilizers may be provided to further enhance stability. Silver is used in the present invention as a stabilizer by way of example and not of limitation. Silver or other precious metals or alloys thereof may be used as stabilizers.

Further use of precious metals to form a superconducting cermet in accordance with the present invention permit anisotropic electronic behavior so as to be used in the good conducting directions, for example, along the Cu—O planes, as explained by Dinger et al in an article entitled "Direct Observation of Electronic Anisotropy in Single-Crystal $Y_1Ba_2Cu_3O_{7-x}$", *Physical Review Letters*, Vol. 58, No. 25, June 22, 1987 (incorporated herein by reference). Thus, the present cermet can be formed to provide anisotropic conditions so as to enhance or provide supercurrent-carrying capabilities and to control current flow in certain directions.

In yet another embodiment, the superconducting cermet of the present invention may be sprayed on a substrate such as a metal, e.g., precious metal, substrate or onto a polymer substrate or on a formed or shaped substrate Layers of sprayed substrates may be provided to provide a composite. If the layers are provided by rolling a body of the superconducting cermet then the grains can be provided in a highly or preferred orientation so as to enhance critical current density. If desired, the substrates may be a stabilizing metal interleafed between the layers. The composites may be further worked, e.g., rolled, drawn or extruded, further facilitating orientation of the grains to provide enhanced properties. In addition, the superconducting cermet of the present invention provides for easier connections to normal conductors.

To further illustrate the invention, a number of superconducting cermets samples were formed, in accordance with the invention, using silver as the precious metal added to the prior art superconducting ceramic in the form of silver oxide in various concentrations to provide, respectively, four samples each of 15, 20, 25, and 30 vol. % silver (metal) concentration in the cermet. The biaxial flexure strength of the resulting cermets were tested, together with three samples of the ceramic alone, i.e., without the addition of silver.

The particular superconducting ceramic used had the formula $YBa_2Cu_3O_{(6.5+x)}$, wherein x is greater than 0 and less than 0.5. The superconducting ceramic was formed by mixing together $-100$ mesh (Tyler) powders of CuO, $BaCO_3$, and $Y_2O_3$ in mole ratios of 1 mole CuO, 2 moles of $BaCO_3$ and $\frac{1}{2}$ mole of $Y_2O_3$. The powders were thoroughly mixed together to provide a uniformly distributed homogeneous powder mixture which was then heated in air at atmospheric pressure to 970° C. and then maintained at this temperature for 6 hours. The sintered mixture was then allowed to cool to 700° C. at a rate of 40° C./hr. The samples were held at 700° C. for 7 hours and then allowed to cool to room temperature after which it was again crushed to $-100$ mesh (Tyler) The entire process was then repeated twice again. After the third sintering, the sintered mass was cooled to 700° C. and air-annealed at this temperature for 7 to 24 hours. The ceramic material was superconducting as evidenced by the Meissner effect. The sintered superconducting ceramic was then again crushed into $-100$ mesh (Tyler) powder in preparation for mixing with the precious metal powder in the form of silver oxide powder.

The crushed superconducting ceramic powder was then thoroughly mixed with various amounts of $-100$ mesh (Tyler) $Ag_2O$ powder to provide four samples each having, respectively, 15, 20, 25, and 30 vol. % silver metal in the final cermet.

The homogeneously mixed powder was then sintered at 970° C. for 7 hours at atmospheric pressure in air and then cooled to 700° C. and air annealed at this temperature for 7 hours.

The silver-containing cermet samples made in accordance with the invention were tested for superconductivity by immersing the cermet sample in a vessel filled with liquid nitrogen and then placing a 0.25 gram permanent magnet above the cermet to see if the permanent magnet was levitated by the cermet, i.e., exhibited the Meissner effect indicative of superconductivity. Each of the tested samples exhibited the Meissner effect. Further, biaxial flexure bars were fabricated following the above procedure and the bars were then tested for biaxial flexure strength. The tested samples were approximately 5 cm long, 0.6 cm wide and 0.55 cm thick. The bulk density of the all-oxide ceramic was only 4.5–4.6 g/cc. The results are listed in the Table below and plotted in the graph of FIG. 1. It will be seen that the addition of as little as 15 vol. % silver resulted in a 4–5 times increase in flexure strength, while the addition of 30 vol. % silver resulted in about an 8 times increase in flexure strength. It should be understood that improved ceramic processing would enable the bulk density of ceramic superconductor to be improved significantly For example, hot forming or forging of the sample can provide bulk densities as high as 98 or even higher. This results in less pores and provides improved strength.

TABLE I

| Sample No. | Volume % Ag | Strength PSI (MPa) |
|---|---|---|
| 1A | 0.0 | 2254.2 (15.54) |
| 1B | 0.0 | 1584.4 (12.07) |
| 1C | 0.0 | 1750.8 (12.07) |
| MEAN (3 Samples) | 0.0 | 1863.1 (12.85) |
| 2A | 15.0 | 9475.1 (65.53) |
| 2B | 15.0 | 7647.8 (52.73) |
| 2C | 15.0 | 7889.1 (54.39) |
| 2D | 15.0 | 8020.4 (55.30) |
| MEAN (4 Samples) | 15.0 | 8253.1 (56.99) |
| 3A | 20.0 | 8850.9 (61.02) |
| 3B | 20.0 | 9933.0 (68.48) |
| 3C | 20.0 | 10188.6 (70.25) |
| 3D | 20.0 | 10017.5 (69.07) |
| MEAN (4 Samples) | 20.0 | 9747.5 (67.21) |
| 4A | 25.0 | 11889.1 (81.97) |
| 4B | 25.0 | 12024.3 (82.90) |
| 4C | 25.0 | 11852.2 (81.72) |
| 4D | 25.0 | 11711.5 (80.75) |
| MEAN (4 Samples) | 25.0 | 11869.3 (81.84) |
| 5A | 30.0 | 14121.0 (97.36) |
| 5B | 30.0 | 16057.4 (110.71) |
| 5C | 30.0 | 16183.3 (111.58) |
| 5D | 30.0 | 13347.1 (92.02) |
| MEAN (4 Samples) | 30.0 | 14927.2 (102.92) |

Figure 2A:
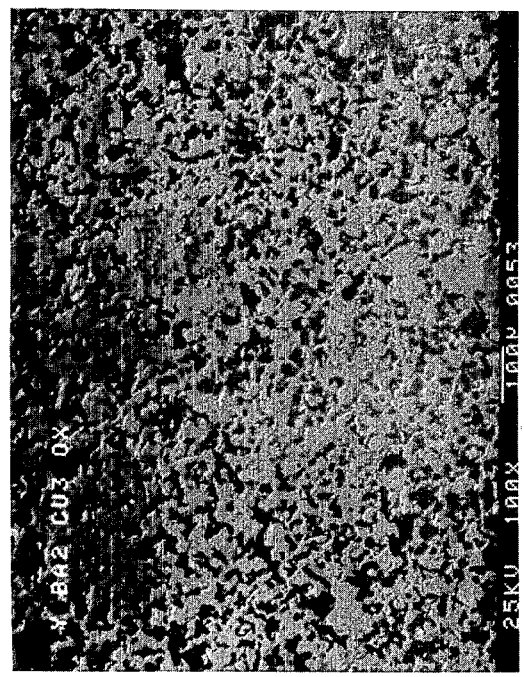
FIG. 2A is a photomicrograph at 100x magnification showing the density of a superconducting ceramic material.

FIGS. 2A and 2B show SEM micrographs of the densities, at 100x magnification, of a prior art superconducting ceramic having the formula $YBa_2Cu_3O_{(6.5+x)}$, wherein x is greater than 0 and less than 0.5, and the same superconducting ceramic formed into a cermet, in accordance with the invention, with 27 volume percent silver. The ceramic structure in FIG. 2A, representing the prior art, had a density of 4.03 grams/cubic centimeter, representing 64.8% of its theoretical density, while the suPerconducting cermet of the invention, shown in FIG. 2B, had a density of 6.1 grams/cubic centimeter, representing 84.2% of its theoretical density. The 15, 20 and 30 vol. % Ag cermet also showed improved density under identical processing conditions, as shown in Table II. Improved processing would improve all these numbers, e.g., we have fabricated oxide superconductor with bulk density as high as 89% by incorporating fine −325 gram powder. Such powders would also produce less porous cermets with improved properties.

TABLE II

| Vol. % Ag | Bulk Density (Observed) | % Theoretical Density |
|---|---|---|
| 0 | 4.03–4.6 | 65 |
| 15 | 5.13 | 75 |
| 20 | 5.4 | 76.5 |
| 25 | 5.42 | 75 |
| 30 | 6.2 | 83 |

Figure 3A:
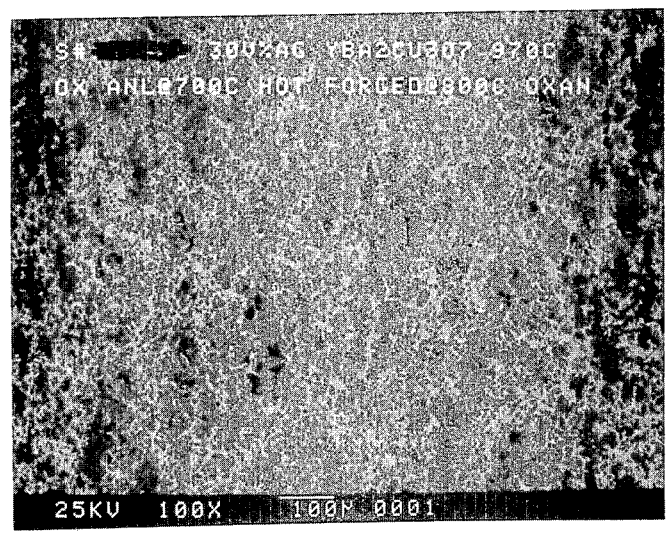
FIG. 3A is a photomicrograph at 100x magnification showing the dense microstructure and preferred orientation of grains of a superconducting cermet of the invention containing 30 volume percent silver after forging.
Figure 3B:
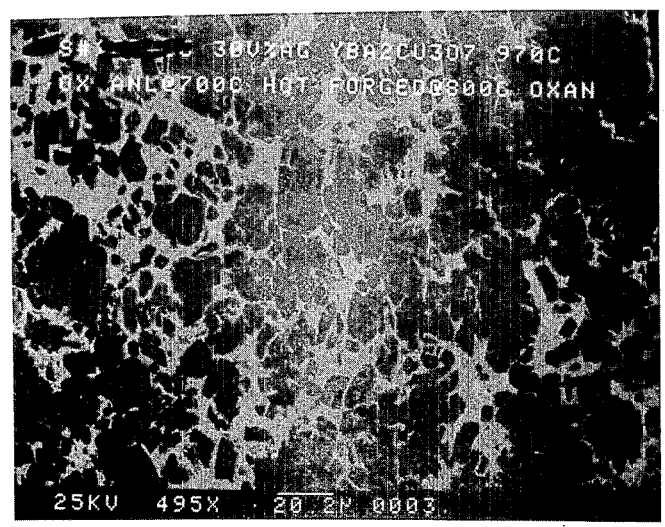
FIG. 3B is a photomicrograph of the cermet shown in FIG. 3A, but at 495x magnification.
Figure 3C:
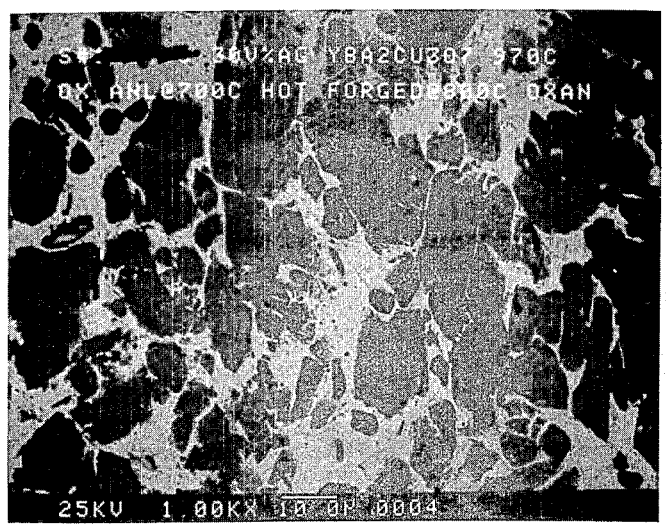
FIG. 3C is a photomicrograph of the cermet shown in FIG. 3A, but at 1000x magnification.

One of the superconducting cermet samples made in accordance with the invention containing 30 vol. % silver was hot forged at 800° C. and then examined under an electron microscope for density and grain orientation. The results are shown in the SEM micrographs of FIGS. 3A–3C which, respectively, show the dense microstructure and grain orientation of the forged superconducting cermet at 100x, 495x, and 1000x magnification. In particular, the unidirectional grain orientation of the cermet resulting from the forging step, which was perpendicular to the forging direction, is indicative of the ability of the material to be extruded into a wire as well as its ability to carry higher critical current densities than the prior art superconducting ceramic materials.

Thus, the invention provides a superconducting cermet having enhanced physical and electrical properties over the corresponding prior art superconducting ceramic material.

Having thus described the invention, what is claimed is:

1. A method of making a super-conducting cermet having superconducting properties with improved bulk density, low porosity and in situ stabilization comprising the steps of:
  (a) forming a structure of
    (i) a superconducting ceramic material having the formula $RM_2Cu_3O_{(6.5+x)}$ wherein R is one or more rare earth elements capable of reacting to form a superconducting ceramic, M is one or more alkaline earth metal elements selected from barium and strontium capable of reacting to form a superconducting ceramic, x is greater than 0 and less than 0.5; and
    (ii) a precious metal compound in solid form selected from the class consisting of oxides, sulfides and halides of silver; and
  (b) liquid phase sintering the mixture at a temperature wherein the precious metal of the precious metal compound is molten and below the melting point of said ceramic material, the liquid phase sintering carried out for a time less than 36 hours but sufficient to improve the bulk density of the cermet.

2. The method in accordance with claim 2 including annealing said sintered mixture at a temperature of from about 650° to 750° C. in an oxygen-containing atmosphere for from about 12 to 36 hours.

3. The method in accordance with claim 1 wherein the precious metal compound contains silver oxide.

4. The method in accordance with claim 1 wherein the superconducting ceramic material is in powder form having a mesh size of −100 (Tyler).

5. The method in accordance with claim 1 wherein the precious metal compound is in powder form having a mesh size of −100 (Tyler).

6. The method in accordance with claim 1 wherein said sintering step is carried out at a temperature of from about 960 to 1000° C.

7. The method in accordance with claim 6 wherein said superconducting ceramic is formed by sintering a mixture of one or more rare earth-bearing materials, one or more alkaline earth metal-bearing materials, and a copper-bearing material in the presence of oxygen at a temperature of from about 900° to 1000° C. for a period of from about 12 to about 36 hours followed by an annealing step conducted for from about 12 to 36 hours at a temperature of from about 650° to about 750° C. in an oxygen-bearing atmosphere.

8. The method in accordance with claim 7 wherein said sintered ceramic material is comminuted into $-100$ mesh (Tyler) particles and the process steps of claim 7 are repeated at least one more time.

9. A method of making a superconducting cermet having superconducting properties with improved bulk density and low porosity comprising the steps of:

(a) forming a powder mixture of:

(i) a $-100$ mesh (Tyler) superconducting ceramic powder material having the formula $YBa_2Cu_3O_{(6.5+x)}$ wherein x is greater than 0 and less than 0.5; and (ii) a $-100$ mesh (Tyler) silver-bearing powder material selected from the group consisting of the oxide, sulfide, or halide of silver;

(b) liquid phase sintering the mixture at a temperature in the range of about 960° to 990° C. to provide a molten silver phase and at a temperature below the melting of the superconducting ceramic, the liquid phase sintering carried out for a time less than 36 hours but sufficient to improve the bulk density of the cermet; and (c) annealing said sintered mixture at a temperature of from about 650° to 750° C. in an oxygen-containing atmosphere for from about 12 to 36 hours.

10. The method in accordance with claim 1 including hot working said cermet, said hot working and liquid phase sintering capable of producing a bulk density of greater than 97% of theoretical density.

* * * * *